United States Patent [19]
Lee et al.

[11] Patent Number: 5,624,498
[45] Date of Patent: Apr. 29, 1997

[54] SHOWERHEAD FOR A GAS SUPPLYING APPARATUS

[75] Inventors: Gil-Gwang Lee; Kazuyuki Fujihara, both of Seoul; Kyu-hwan Chang, Kyungki-do, all of Rep. of Korea

[73] Assignee: Samsung Electronics Co., Ltd., Suwon, Rep. of Korea

[21] Appl. No.: 352,249

[22] Filed: Dec. 8, 1994

[30] Foreign Application Priority Data

Dec. 22, 1993 [KR] Rep. of Korea ............... 93-29053

[51] Int. Cl.$^6$ .................................................. C23C 16/00
[52] U.S. Cl. ........................... 118/715; 118/719; 118/725
[58] Field of Search ........................ 118/715, 719, 118/725

[56] References Cited

U.S. PATENT DOCUMENTS

| 4,209,357 | 6/1980 | Gorin | 156/345 |
|---|---|---|---|
| 4,951,603 | 8/1990 | Yoshino | 118/725 |
| 5,252,131 | 10/1993 | Kiyama | 118/725 |

FOREIGN PATENT DOCUMENTS

| 60-189928 | 9/1985 | Japan | 118/715 |
|---|---|---|---|
| 61-79773 | 4/1986 | Japan | 118/719 |
| 2-184022 | 7/1990 | Japan | 118/726 |
| 2-234419 | 9/1990 | Japan | 118/723 |
| 3-170675 | 7/1991 | Japan | 118/725 |

*Primary Examiner*—Richard Bueker
*Attorney, Agent, or Firm*—Cushman Darby & Cushman IP Group of Pillsbury Madison & Sutro LLP

[57] ABSTRACT

A gas supply apparatus, for use in a semiconductor device manufacturing process, provides a showerhead for evenly supplying various kinds of gases to a reaction chamber. The gas supplying apparatus for use in the formation of a thin film of a semiconductor device includes a first porous plate having a plurality of first holes formed throughout its surface, and a central bore formed at its center; and a second porous plate having first projections which are regularly formed throughout its central portion, and second projections which contain depressions continuously formed around the first projections. The gas supplying apparatus evenly distributes gas into the reaction chamber, thereby improving the uniformity of the film thickness to be grown on a substrate.

15 Claims, 4 Drawing Sheets

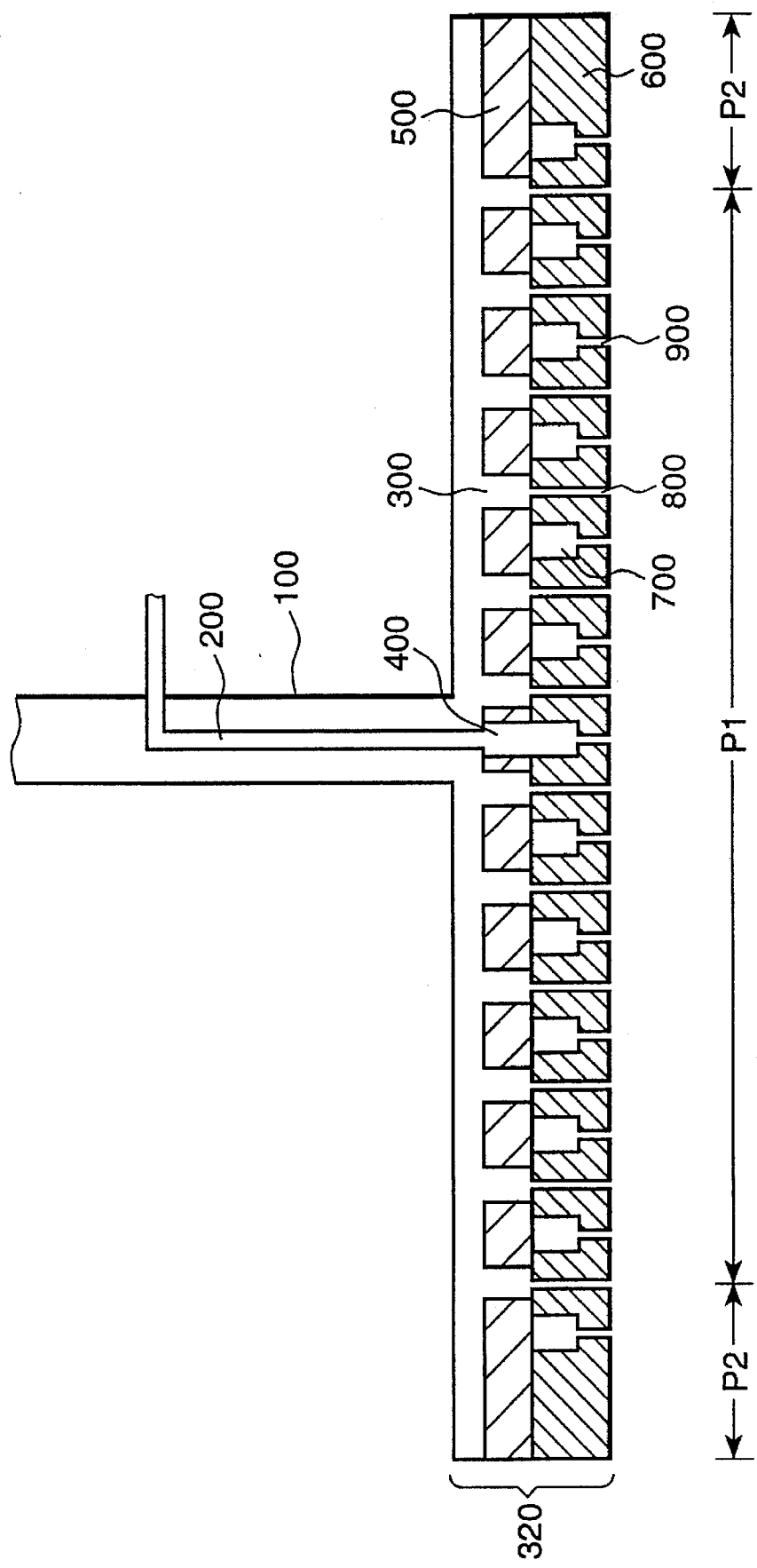

SHOWERHEAD FOR A GAS SUPPLYING APPARATUS

BACKGROUND OF THE INVENTION

The present invention relates to an apparatus for use in the manufacture of a semiconductor device, and more particularly, to a gas supplying apparatus for evenly supplying various gases to a reaction chamber.

The different manufacturing processes of a semiconductor device employ an assortment of apparatuses using various gases which are often toxic and/or reactive. Thus, an apparatus for performing such gas treatment processes requires numerous safety devices, especially for guarding against gas leaks. On the other hand, to manufacture reliable devices, the apparatus should precisely control the amount of gas flow, in addition to preventing the leakage of hazardous gases.

In an apparatus as above, the gas is supplied to the reaction chamber from a main gas reservoir via a main gas line and individual gas lines and is used for growing a film. Thus, it is important to keep the gas lines clean and ensure that the gases do not react with one another until being supplied to the reaction chamber, such that the reaction occurs only in the reaction chamber.

Among semiconductor processing apparatuses, a chemical vapor deposition (CVD) apparatus is widely used for growing many kinds of film. The CVD method is used for forming a thin film or an epitaxial layer on a semiconductor substrate by a chemical reaction after decomposing a compound in a vapor state. The CVD process is different from other semiconductor device manufacturing processes in that a thin layer can be formed by introducing a gas to a reaction chamber. Here, an effective CVD reaction occurs over a wide temperature range (about 100°–1200° C.), and plasma energy by radio frequency (RF) power, optical energy (e.g., a laser or ultraviolet light) and heat are used for decomposing the introduced gas. Also, the semiconductor substrate is heated to promote the reaction of the decomposed atom or molecule and to control the physical properties of the formed film.

Generally speaking, the CVD method is divided into an atmospheric pressure CVD (APCVD) method and a low pressure CVD (LPCVD) method, according to the degree of vacuum in the reaction chamber during the process.

Recently, CVD methods have been adopted extensively in the semiconductor industry due to certain distinct merits: (a) silicon epitaxial layers can be formed with the desired thicknesses and resistances, (b) polysilicon, silicon oxide and silicon nitride layers can be obtained at low cost, and (c) the silicon oxide and silicon nitride layers (for the protection of silicon devices) can be formed at relatively low temperatures.

A physicochemical characteristic of the thin layer obtained by the CVD method is determined by the construction of the substrate (e.g., amorphous, polycrystalline or crystal) on which a thin film is deposited and the deposition conditions (i.e., temperature, growing rate, pressure, etc.). Generally, the above variables affect the surface mobility of the deposited atoms, thereby determining the construction and other characteristics of the film.

Here, two CVD apparatuses and their gas supply methods (disclosed in Japanese Patent Applications Nos. 89-264258 and 92-7825) will be described. The conventional CVD apparatuses are shown in FIGS. 1 and 2.

First, FIG. 1 is a diagram schematically showing the construction of a CVD apparatus using plasma.

As shown in FIG. 1, the plasma CVD apparatus comprises a reaction chamber 12, a susceptor 14 disposed horizontally inside the reaction chamber, and a shower head 19. Here, a silicon substrate 13 is seated on the susceptor 14. Situated above reaction chamber 12, a first gas supply pipe 15 is connected to shower head 19 and a first mass flow controller 16 controls the amount of gas flowing in the first gas supply pipe. Also, a booster pump 11 and a rotary pump 10 are connected beneath reaction chamber 12 for controlling the pressure and drawing off the gas within the reaction chamber. Provided on one side of reaction chamber 12, an incubator 18 generates gas by evaporating the liquid in a liquid source 17, and a second gas supply pipe 20 introduces the gas from the liquid source, the amount of which is controlled by a second mass flow controller 21.

Next, FIG. 2 is a diagram schematically showing the constitution of the conventional LPCVD apparatus.

Referring to FIG. 2, the LPCVD apparatus comprises a reaction chamber 33, a susceptor 25 disposed horizontally inside the reaction chamber, a shower head 32, and a heating block 29 for heating a silicon substrate 28 seated on the susceptor. Situated above reaction chamber 33, a first gas supply pipe 34 is connected to shower head 32, and an RF generating apparatus 31 is connected to the first gas supply pipe. Also, a mass flow controller 27 controls the amount of gas flowing in the first gas supply pipe 34. A booster pump 24 and a rotary pump 23 are connected beneath reaction chamber 33 for controlling the pressure and drawing off the gas within the reaction chamber. Provided above and to the side of reaction chamber 33, an incubator 30 generates gas by evaporating the liquid in a liquid source 22, and a second gas supply pipe 26 introduces the gas from the liquid source.

As above, both ga supply methods of the conventional CVD apparatuses shown in FIGS. 1 and 2 prevent the gases from interacting before reaching the reaction chamber. The above methods are generally employed for the purpose of preventing particle generation or the clogging of the gas supply pipes; problems which are the result of the gases becoming mixed prematurely and thus reacting with each other outside the reaction chamber. In these methods, however, the gas is not distributed evenly inside the reaction chamber, and as a result, the uniformity of the film thickness grown on the substrate is adversely affected.

SUMMARY OF THE INVENTION

It is an object of the present invention to enhance productivity and increase the reliability of a showerhead for a gas supplying apparatus used in the manufacture of semiconductor devices, to improve the uniformity of deposited thin films and overcome the problems caused by conventional gas supply methods. The present invention has particular utility in a gas supply apparatus, such as a CVD apparatus, used for depositing a thin film on a surface of a semiconductor substrate.

To achieve the above object, the showerhead of the present invention maximizes the uniformity of the thin film, thereby improving the efficiency of production and the reliability of the semiconductor device.

The present invention encompasses a showerhead for a gas supply apparatus having concentric first and second gas supply pipes, including a first porous plate having a plurality of first holes formed therein in fluid communication with the first gas supply pipe and a central bore formed therein in fluid communication with the second gas supply pipe, and a second porous plate secured to the first plate, the second plate having a plurality of second holes longitudinally aligned with corresponding ones of the first holes.

The second holes are formed at the center of first projections, corresponding to the first holes, and have a smaller size than the first holes. Third holes are formed in the depressions between the first projections in communication with recesses formed in the second porous plate. The third holes are the same size as the second holes. The diameter of the second and third holes is smaller than that of the first holes.

The first and second porous plates are combined, such that the gas passing through the first holes is sprayed through the second holes and the gas passing through the recesses is sprayed through the third holes. Also, the first and second porous plates are composed of stainless steel or an aluminum alloy whose surface is plated with $Al_2O_3$.

The gas supplying apparatus according to the present invention provides even distribution of the gas in the reaction chamber using the shower head, thereby improving the uniformity of a thin film's thickness to be grown on a substrate.

BRIEF DESCRIPTION OF THE DRAWINGS

The above objects and advantages of the present invention will become more apparent by describing in detail a preferred embodiment thereof with reference to the attached drawings in which:

FIG. 3 is a schematic constructional diagram of a showerhead for a gas supply method according to the present invention.

DETAILED DESCRIPTION OF THE INVENTION

Figure 1:
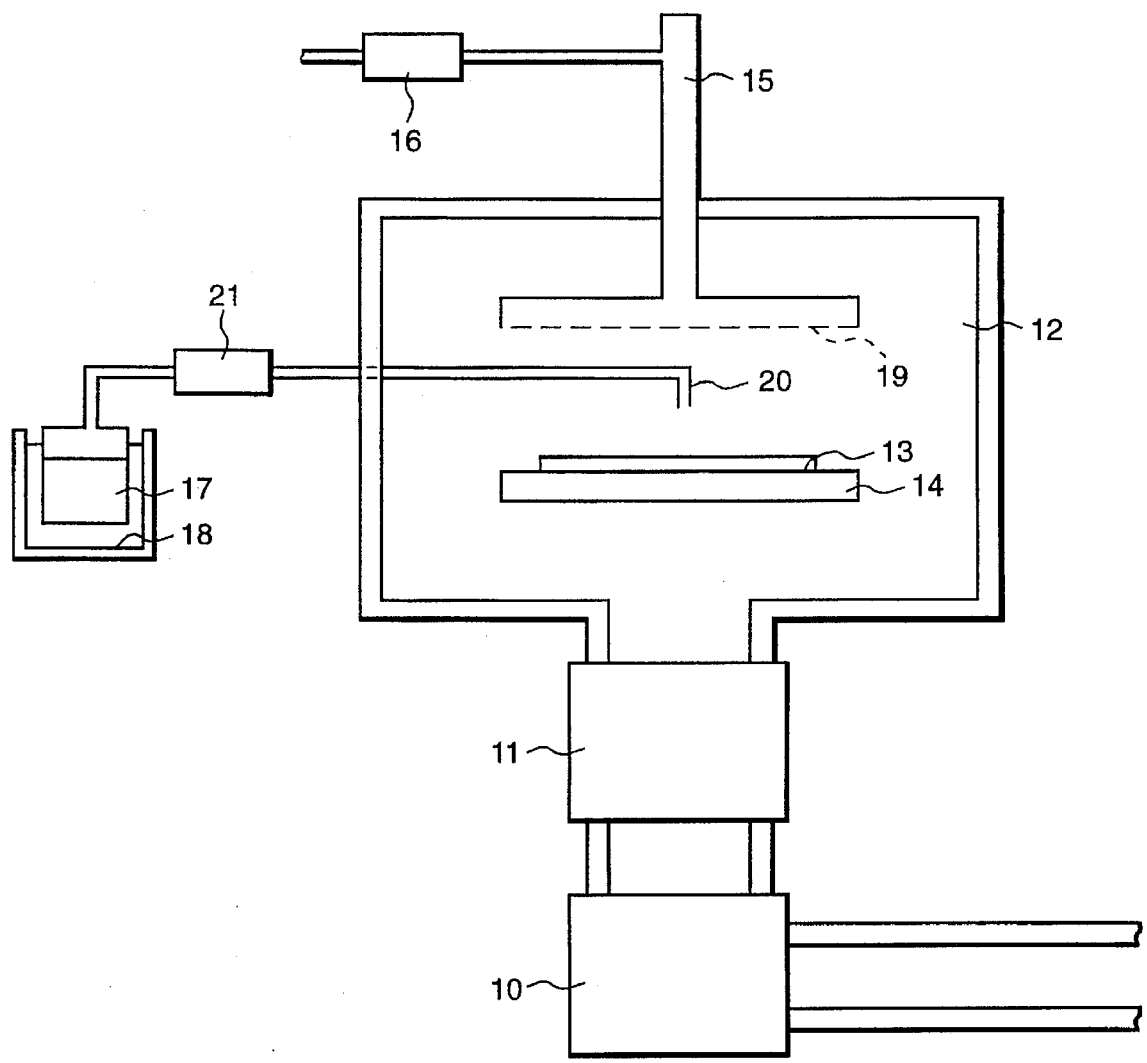
FIG. 1 is a schematic constructional diagram for describing the gas supply method of a conventional plasma CVD apparatus.
Figure 2:
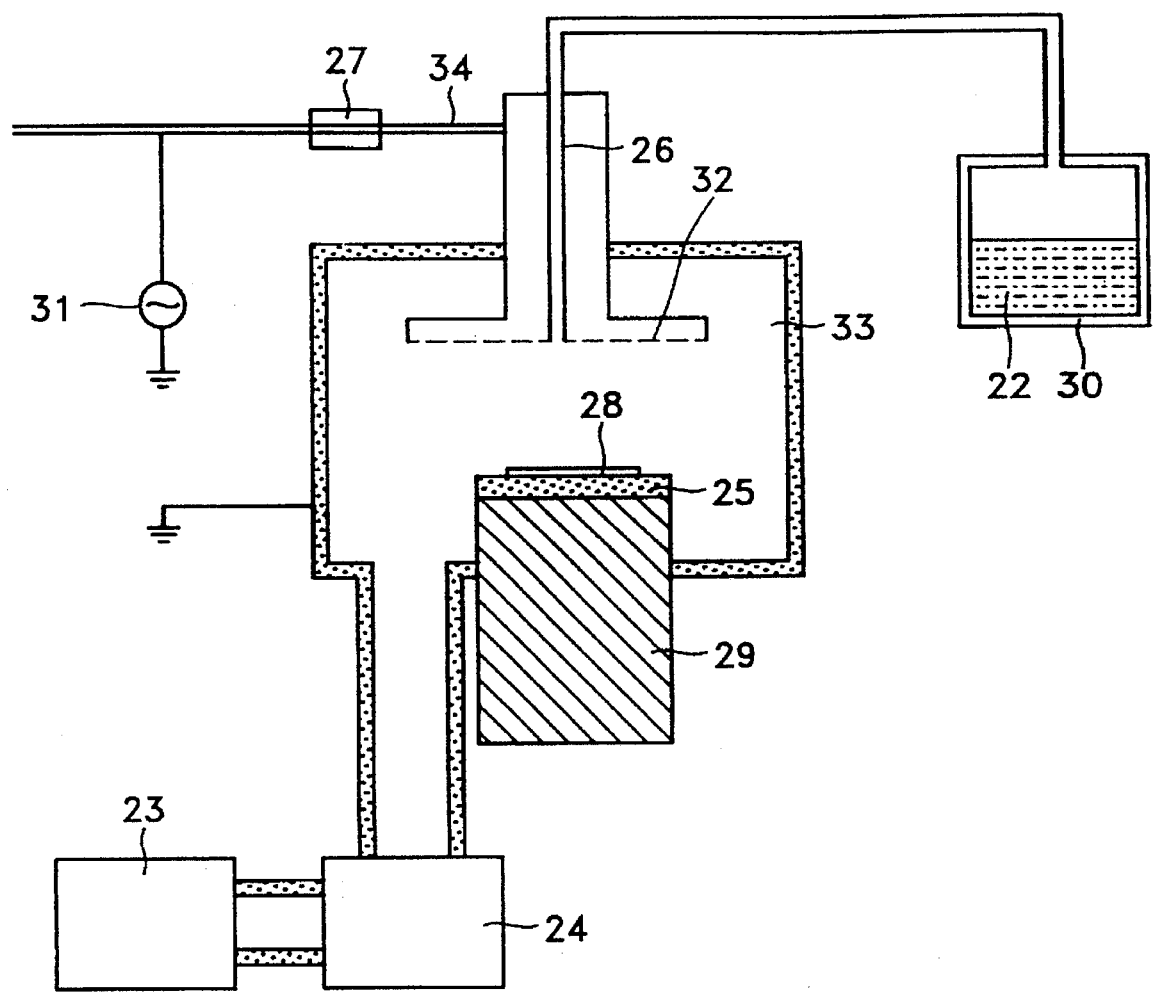
FIG. 2 is a schematic constructional diagram for describing the gas supply method of a conventional low pressure CVD apparatus.

With reference now to FIG. 3, a preferred embodiment of a showerhead 320 for a gas supply apparatus used in an improved CVD apparatus, according to the present invention, will now be described. As shown in FIG. 3, the gas supply apparatus comprises shower head 320. First and second concentric gas supply pipes 100 and 200 are connected to shower head 320. Shower head 320 includes first porous plate 500, connected at the bottom of first gas supply pipe 100, and second porous plate 600, connected to the bottom of first porous plate 500. Further, first and second gas supply pipes 100 and 200 are connected to first porous plate 500 constituting the upper portion of shower head 320. In particular, first porous plate 500 is connected to first gas supply pipe 100 via a plenum 330.

As shown in FIG. 3, first porous plate 500 has a plurality of first holes 300 and central bore 400, which is relatively large and formed at the center of the plate. Also, second holes 800, corresponding to first holes 300 and having diameters one-half (or less) of the diameters of first holes 300, are formed in second porous plate 600. In addition, third holes 900 are formed in second porous plate 600, for outflowing the gas via recesses 700, which gas passes through central bore 400.

In more detail, second porous plate 600 has first projections P1 which are regularly formed throughout the central portion of the plate and second projections P2 which are formed around first projections P1. Also, second holes 800 are formed in second porous plate 600, corresponding to first holes 300 and having a diameter smaller than that of the first holes 300. Third holes 900, whose diameter is equal to that of second holes 800, are formed in the recesses of the depressed area between first projections P1.

The present invention, in operation, provides for the flowing of gas as follows. Gas passed through first gas supply pipe 100 is sprayed into the reaction chamber (not shown) via first holes 300 of first porous plate 500 and second holes 800 of second porous plate 600. Gas passed through second gas supply pipe 200 is sprayed into the reaction chamber via central bore 400 of first porous plate 500, along the recesses 700 and out through third holes 900 which are formed throughout second porous plate 600. Here, the plurality of recesses 700 are connected to each other, thereby surrounding a projected portion (refer to FIG. 4B). Thus, gas passed through central bore 400 can be evenly distributed over the whole surface of second porous plate 600.

Figure 4A:
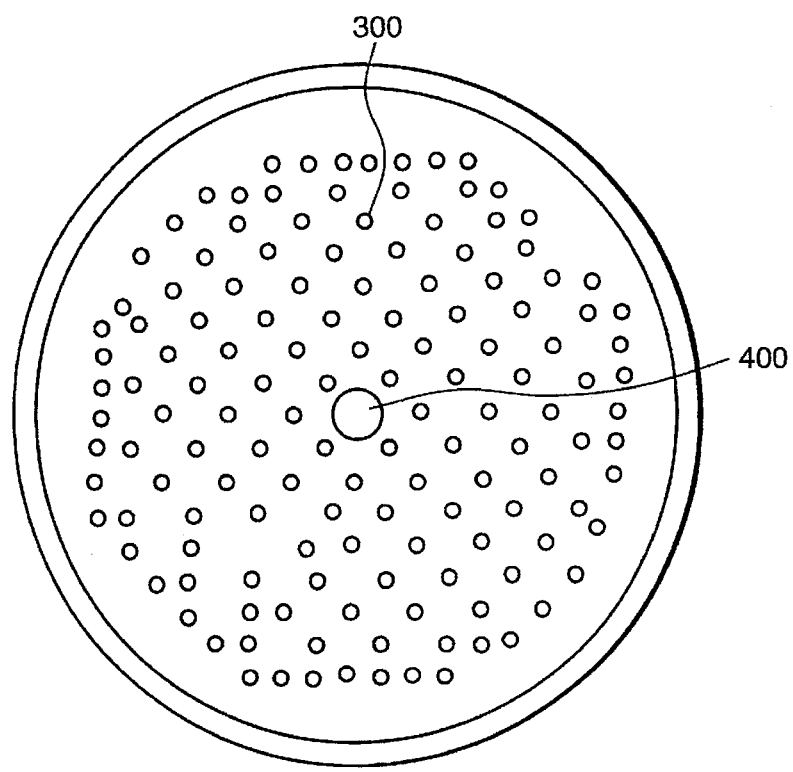
FIGS. 4A and 4B are plan views showing the first and second porous plates of the showerhead shown in FIG. 3.
Figure 4B:
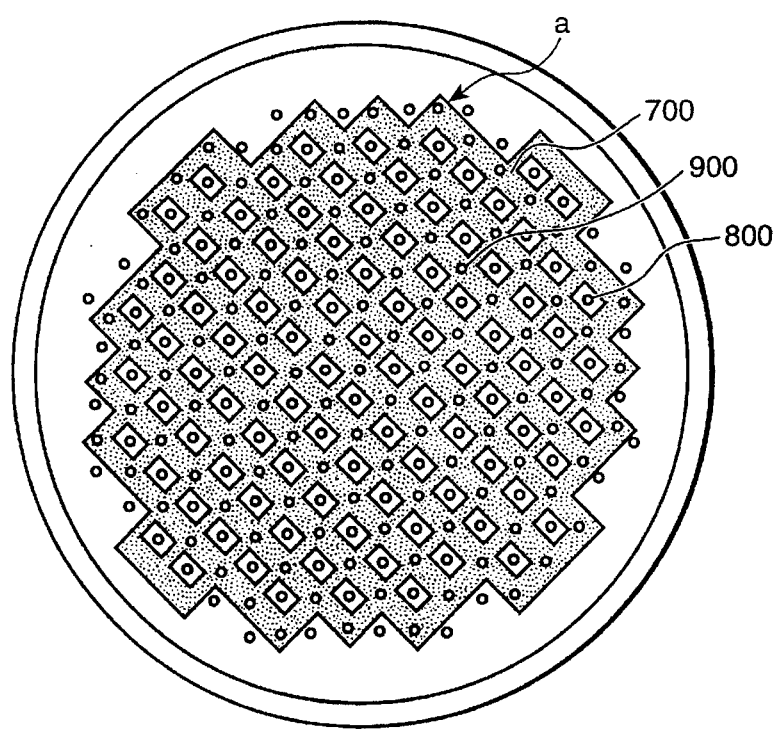

A plan view of the gas supply apparatus of FIG. 3 is shown in FIGS. 4A and 4B, which figures will now be referred to for describing in detail the first and second porous plates of the gas supply apparatus according to the present invention.

As shown by FIG. 3 and FIG. 4A, first porous plate 500 has a cylindrical shape, a multiplicity of first holes 300 dispersed over the whole cylindrical plate and central bore 400 formed at its center.

As shown by FIG. 4B, second porous plate 600 has a multiplicity of holes 800 and 900 formed in the same manner as the holes in first porous plate 500. The size of holes 800 and 900 is one half (or less) that of first holes 300 of first porous plate 500. The recesses 700 of second porous plate 600 are formed in depressed area "a" and are used for conducting the gas, introduced to the depressed area "a" via central bore 400, after gas has flowed over the entire porous plate.

First porous plate 500 and second porous plate 600 are made of stainless steel or an alloy aluminum whose surface is plated with $Al_2O_3$.

In the gas supply apparatus, according to the present invention, the gas passed through first gas supply pipe 100 is sprayed into the reaction chamber via first holes 300 of first porous plate 500 and second holes 800 of second porous plate 600. The gas passed through second gas supply pipe 200 is sprayed into the reaction chamber via central bore 400 of first porous plate 500, along a plurality of recesses 700 and out through third holes 900, which are formed throughout second porous plate 600.

Therefore, according to the above apparatus, the gases flowing via first and second gas supply pipes 100 and 200 are supplied to second porous plate 600 via two different pathways: the first pathway being from first gas supply pipe 100, through first holes 300 and then through second holes 800, and finally into the reaction chamber; and the second pathway being from second gas supply pipe 200, through central bore 400 and then through third holes 900, and finally into the reaction chamber. Thus, the gas supplied via the first and second pathways can be evenly sprayed into the reaction chamber without being mixed with each other.

Therefore, according to the gas supply apparatus of the present invention, gas from first and second supply pipes can be evenly distributed in the reaction chamber, without any undue mixing therebetween, thereby improving the uniformity of the thin film thickness formed on a surface of a semiconductor device during the CVD process.

The present invention is not restricted to the above described preferred embodiment, as various modifications within the scope of the claims of the present invention will be readily apparent to those of ordinary skill in the art.

What is claimed is:

1. A showerhead for a gas supply apparatus having a first gas supply pipe and a second gas supply pipe having a smaller diameter than that of the first gas supply pipe and disposed along a longitudinal axis thereof, the showerhead comprising:

a first plate having a plurality of first holes formed therein in fluid communication with the first gas supply pipe, and a central bore formed therein in fluid communication with the second gas supply pipe;

a second plate secured to said first plate, said second plate having a plurality of second holes longitudinally aligned with corresponding ones of said first holes, a plurality of interconnected gas distribution chambers in fluid communication with one another and with said central bore, and a plurality of third holes in fluid communication with corresponding ones of said gas distribution chambers;

wherein said second and third holes have smaller diameters than those of said first holes; and, wherein said first and second holes provide a first gas pathway between the first gas supply pipe and the exterior of the showerhead, and said central bore, said gas distribution chambers and said third holes provide a second gas pathway between the second gas supply pipe and the exterior of the showerhead.

2. The showerhead as set forth in claim 1, wherein said second and third holes have diameters which are no more than one-half those of said first holes.

3. The showerhead as set forth in claim 2, wherein the gas supply apparatus is part of a CVD apparatus for forming a thin film on a surface of a semiconductor device.

4. The showerhead as set forth in claim 2, wherein the diameters of said second and third holes are the same.

5. The showerhead as set forth in claim 1, wherein the first and second gas supply pipes are arranged in a concentric configuration.

6. The showerhead as set forth in claim 1, further comprising a plenum disposed between the first gas supply pipe and said first plate, for distributing gas from the first gas supply pipe to said first holes.

7. The showerhead as set forth in claim 1, further comprising a plenum fluidly interconnecting the first gas supply pipe and said first holes.

8. A showerhead for a gas supply apparatus having a first gas supply pipe and a second gas supply pipe having a smaller diameter than that of the first gas supply pipe and disposed along a longitudinal axis thereof, the showerhead comprising:

a first plate having a plurality of first holes formed therein in fluid communication with the first gas supply pipe, and a central bore formed therein in fluid communication with the second gas supply pipe;

a second plate secured to said first plate, said second plate having a plurality of spaced-apart projections depending therefrom, each of said projections having a second hole longitudinally aligned with a corresponding one of said first holes, a plurality of interconnected gas distribution chambers formed between said first projections in fluid communication with one another and with said central bore, each of said gas distribution chambers having an outlet orifice, said outlet orifices having diameters less than those of said first holes;

wherein said second holes have smaller diameters than those of said first holes; and, wherein said first and second holes provide a first gas pathway between the first gas supply pipe and the exterior of the showerhead, and said central bore, said gas distribution chambers and said outlet orifices provide a second gas pathway between the second gas supply pipe and the exterior of the showerhead.

9. The showerhead as set forth in claim 8, wherein said second holes and outlet orifices have diameters which are no more than one-half those of said first holes.

10. The showerhead as set forth in claim 9, wherein the gas supply apparatus is part of a CVD apparatus for forming a thin film on a surface of a semiconductor device.

11. The showerhead as set forth in claim 9, wherein the diameters of said second holes and outlet orifices are the same.

12. The showerhead as set forth in claim 8, wherein the first and second gas supply pipes are arranged in a concentric configuration.

13. The showerhead as set forth in claim 8, further comprising a plenum disposed between the first gas supply pipe and said first plate, for distributing gas from the first gas supply pipe to said first holes.

14. The showerhead as set forth in claim 8, further comprising a plenum fluidly interconnecting the first gas supply pipe and said first holes.

15. The showerhead as set forth in claims 1 or 8, wherein said first and second plates are each comprised of a material selected from the group consisting of stainless steel and aluminum alloy having a surface plated with $Al_2O_3$.

* * * * *